(12) United States Patent
Schripsema

(10) Patent No.: US 8,558,709 B2
(45) Date of Patent: Oct. 15, 2013

(54) SYSTEM FOR COMBINING DIRECT CURRENT POWER FROM MULTIPLE INPUTS

(76) Inventor: Jason Schripsema, Sacramento, CA (US)

( * ) Notice: Subject to any disclaimer, the term of this patent is extended or adjusted under 35 U.S.C. 154(b) by 491 days.

(21) Appl. No.: 12/942,750

(22) Filed: Nov. 9, 2010

(65) Prior Publication Data

US 2011/0121984 A1 May 26, 2011

Related U.S. Application Data

(60) Provisional application No. 61/280,710, filed on Nov. 9, 2009, provisional application No. 61/363,883, filed on Jul. 13, 2010.

(51) Int. Cl.
G08B 21/00 (2006.01)

(52) U.S. Cl.
USPC ............... 340/636.12; 340/636.1; 340/636.19

(58) Field of Classification Search
USPC .................... 340/635, 636.1, 636.12, 636.13, 340/636.19, 651, 657, 660, 663, 664; 136/244, 246, 256; 60/641.8, 641.12; 361/93, 102, 104
See application file for complete search history.

(56) References Cited

U.S. PATENT DOCUMENTS

| | | | |
|---|---|---|---|
| 6,472,878 B1 | 10/2002 | Bruchmann | |
| 6,738,246 B1 | 5/2004 | Strumpler | |
| 6,966,184 B2 * | 11/2005 | Toyomura et al. | 60/641.8 |
| 7,057,311 B1 | 6/2006 | Zhou et al. | |
| 2004/0174664 A1 | 9/2004 | Werner et al. | |
| 2011/0273015 A1 * | 11/2011 | Adest et al. | 307/43 |

OTHER PUBLICATIONS

International Search Report issued on Jul. 29, 2011 for PCT/US2010/056006.
FHS 40-P/SP600 Minisens, http://www.lem.com/docs/products/fhs%2040-p%20sp600.pdf, published befoe Nov. 9, 2010, 18 pages.
"HomeRun Disconnecting Combiner Boxes" web page, published before Jul. 13, 2010, 1 sheet.

* cited by examiner

*Primary Examiner* — Van T. Trieu
(74) *Attorney, Agent, or Firm* — Niels Haun; Dann, Dorfman, Herrell & Skillman, P.C.

(57) ABSTRACT

A system for combining multiple direct current power sources is provided. The system is operable to combine multiple feeds from an array of power generating elements, such as solar panel arrays and combine the feeds into a single voltage output. The system includes a current monitoring assembly operable to monitor the current from each input to evaluate whether there is a malfunction or other problem associated with a particular output. An alarm or other signal can be provided to inform the operator of which power generating element in the array need to be analyzed.

24 Claims, 6 Drawing Sheets

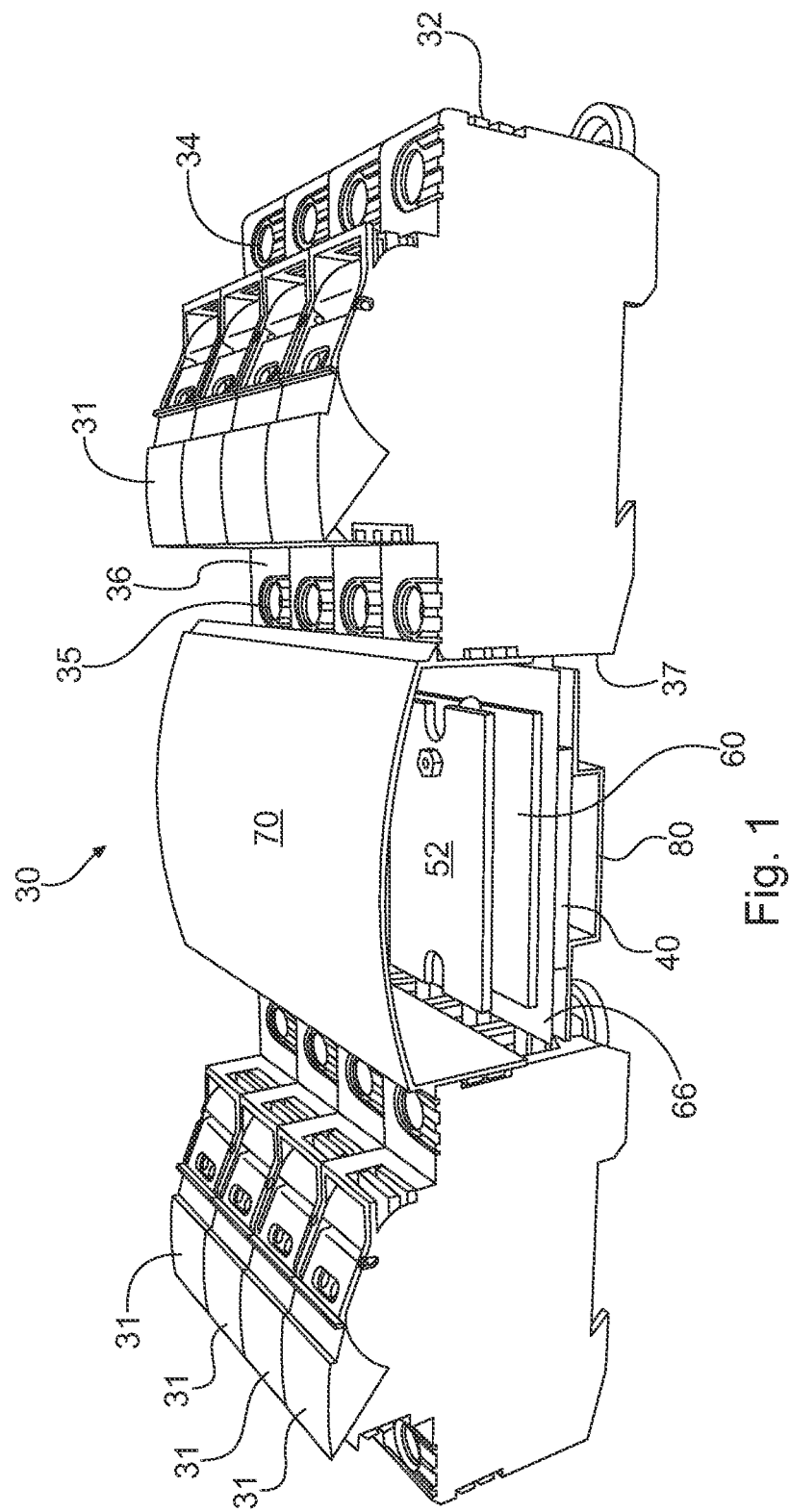

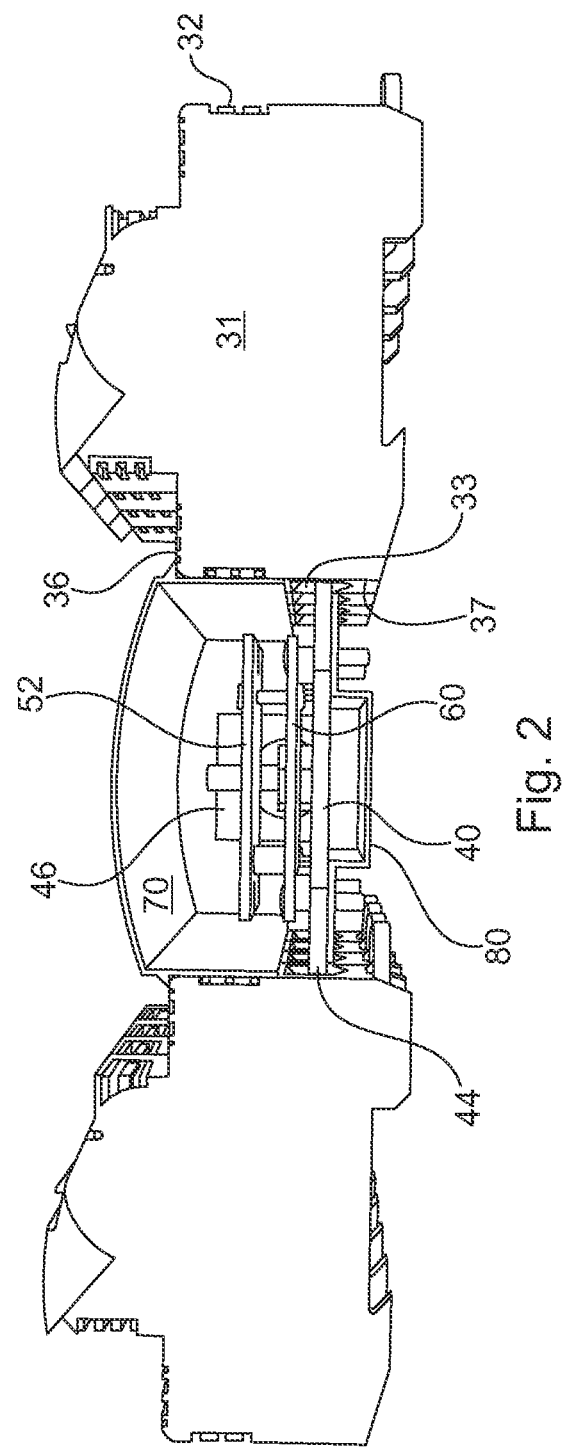

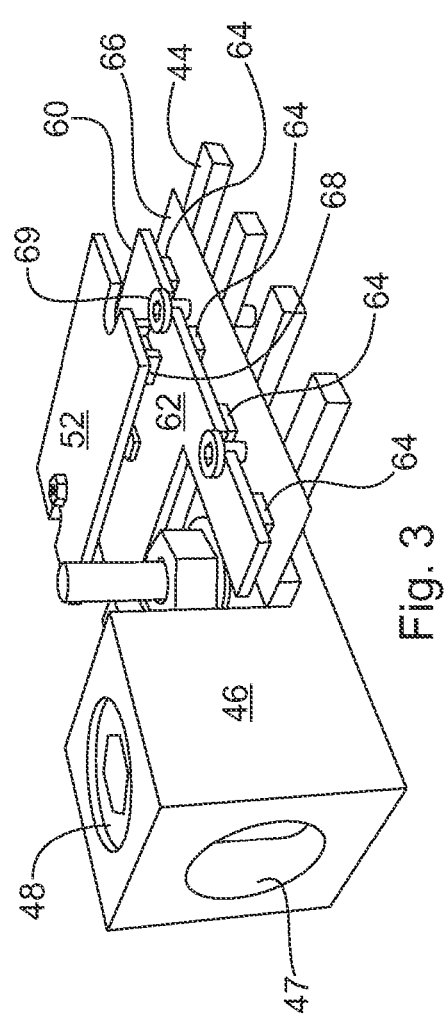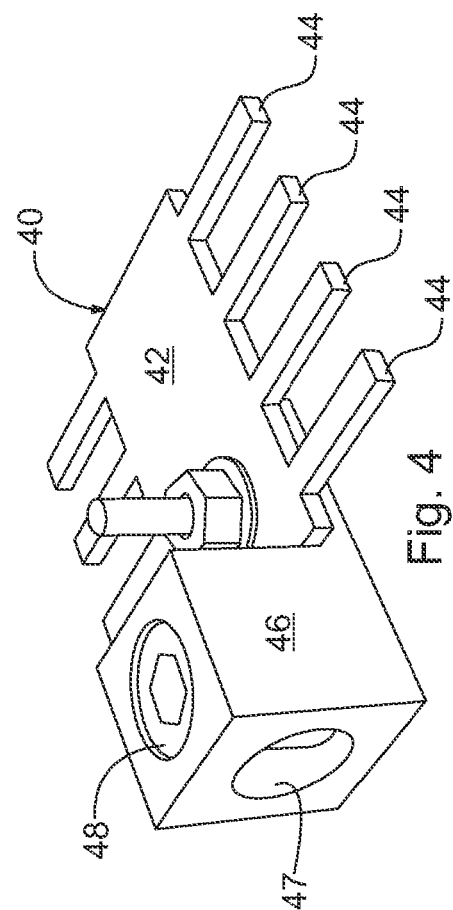

SYSTEM FOR COMBINING DIRECT CURRENT POWER FROM MULTIPLE INPUTS

PRIORITY CLAIM

This application claims priority to U.S. Provisional Patent Application No. 61/280,710, filed Nov. 9, 2009. This application also claims priority to U.S. Provisional Patent Application No. 61/363,883, filed Jul. 13, 2010. The entire contents of the foregoing applications are hereby incorporated by reference.

FIELD OF THE INVENTION

The present invention relates to the field of combining multiple power sources to provide a single output. More specifically, the present invention relates to a system for combining the power generated by multiple solar panels or multiple solar panel arrays.

BACKGROUND

The use of solar panels to produce electricity continues to expand as individuals and business seek ways to reduce electrical costs and greenhouse gas emissions. As the use of solar power increases, so do the size of the arrays used to produce the solar power. In order to harness the energy it is desirable to combine the electrical output from portions of the array, but to be able to monitor the output of the various portions to detect if there is a malfunction in a certain section of a solar array. One malfunction that can result in significant damage is arcing. Large solar arrays produce high voltages, and if there is a short in one of the circuits from the array, the wires will arc as long as the solar panels are in the sunlight. The electrical arc can produce extremely high temperatures that can burn or melt through insulation, connectors, or enclosures and start fires.

SUMMARY OF THE INVENTION

The present invention provides a system for combining multiple source circuits of solar panels to produce a single combined output circuit. The system further provides a mechanism for monitoring the current of each electrical input from each source circuit. More specifically, the system includes a combiner assembly attached to a plurality of photovoltaic source circuits that creates an output circuit. The output from one or more source circuits is connected to a busbar. The busbar includes a plurality of elongated fingers each of which is in electrical communication with the output from at least one of the source circuits. A sensor adjacent each finger of the busbar detects the current passing through the finger of the busbar. The sensor provides a signal indicative of the amount of current flowing through the respective finger of the busbar. The sensor may be a Hall effect sensor mounted adjacent the busbar finger so that the Hall effect sensor is responsive to the magnetic field produced by the electric current flowing through the finger of the busbar.

According to another aspect, signals produced by the Hall sensors can be used to measure the amount of current produced by each source circuit as well as to detect problems in a source circuit such as an arc fault. The assembly may also include a contactor to disconnect the output of the combiner assembly in the case a fault is detected thereby interupting the flow of current in the arcing circuit.

DESCRIPTION OF THE DRAWINGS

The foregoing summary and the following detailed description of the preferred embodiments of the present invention will be best understood when read in conjunction with the appended drawings, in which:

FIG. 1 is a perspective view of a positive input assembly of a system for combining direct current power;

FIG. 2 is an alternate perspective view of the positive input assembly illustrated in FIG. 1;

FIG. 3 is a fragmentary perspective view of a busbar and current monitoring assembly of the positive input assembly illustrated in FIG. 1;

FIG. 4 is a perspective view of the busbar illustrated in FIG. 3;

DETAILED DESCRIPTION OF THE INVENTION

Figure 6:
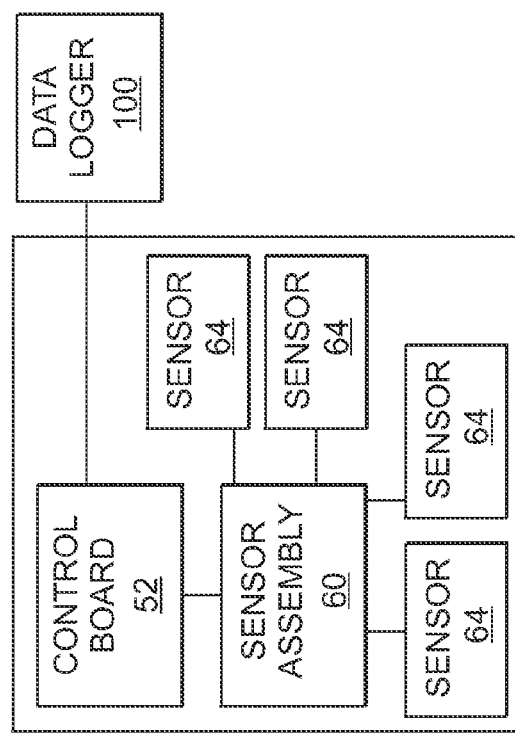
FIG. 6 is a schematic diagram of a current monitoring assembly of the system for combining direct current power illustrated in FIG. 5.

Referring now to the figures, a system for combining direct current power is designated generally 10. The system 10 includes a combiner box 20 for receiving the power output from a plurality of power producing devices, such as solar panels designated PV1, PV2, PV3, PV4 in FIG. 5. The combiner box 20 includes an enclosure, such as a weatherproof steel or fiberglass box 22. Mounted in the box 22 is a negative terminal assembly 24 and a positive terminal assembly 30. The power producing devices PV1-PV4 are connected with the positive and negative terminal assemblies 24, 30 and combined to produce a single DC output.

Figure 5:
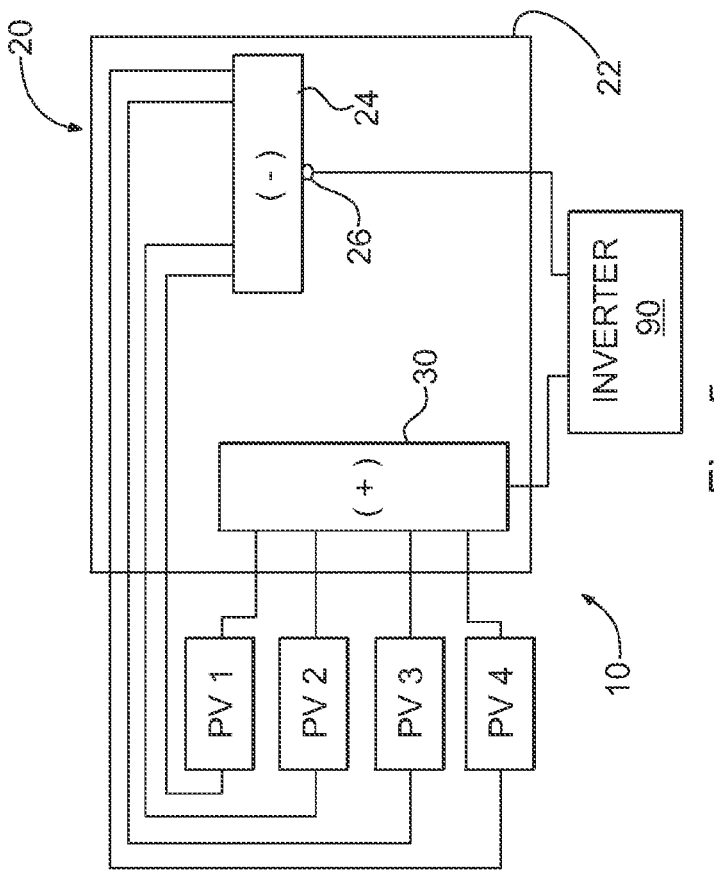
FIG. 5 is a schematic diagram of a system for combining direct current power.

Referring now to FIGS. 1-6, the details of the system 10 will be described in greater detail. The electrical generating elements may be any of a variety of devices for producing electricity. In the present instance, the electrical generating elements are photovoltaic (PV) cells. More specifically, the electrical generating elements are a plurality of solar panels. Each electrical input to the combiner box 20 may be from a single solar panel. However, in the present instance, the output from a plurality of solar panels is interconnected to provide a single electrical output. These interconnected solar panels are referred to as a string. A plurality of the strings forms an array of solar panels. In FIG. 5 the system includes four strings identified as PV1, PV2, PV3 and PV4. However, it should be understood that PV1-PV4 may represent a single panel or multiple panels. Additionally, although the present system is particularly suited for solar power applications, the system is also operable with non-solar power producing elements. In non-solar applications, PV1-PV4 would represent alternative power producing elements.

In FIG. 5, the output from each string (PV1-PV4) is connected with the negative terminal assembly 24 and the positive terminal assembly 30. The negative terminal assembly 24 comprises a terminal block to provide a common conductor for all of the negative conductors from the strings. The negative terminal assembly 24 includes a plurality of sockets and corresponding connectors for receiving and retaining a conductor from one of the strings. Additionally, the negative terminal assembly 24 includes an output lug 26 for connecting an output negative conductor from the terminal assembly.

The positive terminal assembly 30 will now be described in greater detail with reference to FIGS. 1-4. The positive terminal assembly 30 includes a bus bar 30 attached to a plurality of over-current protection protection elements, such as circuit breakers or fuses. In the present instance the over-current protection elements are fuses, each of which is housed in a fuse holder 31. FIGS. 1-4 illustrate an exemplary embodiment in which the positive terminal assembly is configured to receive conductors from up to eight power inputs (e.g. eight solar panel strings PV1-PV8). The assembly may be configured so that all of the positive conductors connect to the assembly on a single side. However, in the present instance, the assembly provides a dual-sided configuration with a pair of parallel rows of fuse holders 31. As discussed further below, the front face 37 of each fuse holder 31 opposes the front face of a fuse holder in the opposite row, so that the front faces of the fuse holders form a channel between the rows, with a busbar 40 connecting the rows of fuse holders.

Each fuse holder 31 includes a wire socket 32 for receiving a positive conductor from one of the power inputs (i.e. PV1-PV8). A connector 34 on each fuse holder is operable to retain the wire in the wire socket 32. For instance, the connector may be a threaded element operable to clamp the wire to retain the wire in the socket. Similarly, the fuse holder 31 also includes a second socket 33 for connecting the fuse holder to the bus bar socket. A second connector 35 for each fuse holder 31 is operable to retain the busbar in the second socket 33. In the present instance, the second connector 35 is similar to the wire connector 34, so that threading the connector clamps the busbar in the second socket 33. An exemplary fuse holder 31 for the positive terminal assembly 30 is a fuse holder made by Wohner under the name AMBUS EasySwitch part number 31110.

The busbar 40 of the positive terminal assembly 30 is illustrated in FIG. 4. The busbar 40 Is an electrically conductive element, such as copper, aluminum or other highly conductive material. The busbar 40 includes a central conductive body 42 and a plurality of elongated fingers 44 that project away from the central body portion. In the present instance, the fingers are spaced around the central body to form two rows of fingers, however, the busbar may be configured so that the fingers extend from a single side of the central body or alternatively from one or both of the ends.

In the present instance, each row of fingers comprises a plurality of generally parallel fingers spaced apart from one another along an edge of the central body 42. The fingers 44 are elongated so that each finger has two portions. The first portion is a terminal end portion that extends into a bus connector 33 of one of the fuse holders. The second portion is an intermediate portion that extends between the front face 37 of the fuse holder and the edge of the bus bar. In the present instance, intermediate portion of the finger is at least approximately ¼ of the length of the finger and preferably at least approximately ⅓ the length of the finger. In this way, the elongated fingers extends into the fuse holder to form an electrical connection with the fuse holder, while maintaining the central body of the busbar spaced apart from the fuse holder.

As described above, each finger 44 of the busbar is configured to be connected with a fuse holder, so that each busbar finger is in electrical communication with a positive conductor of one of the strings of solar panels. In this way, the central body of the bus bar is in electrical communication with all of the strings connected with the positive terminal assembly, thereby combining all of the power produced by the strings attached to the assembly.

An output lug 46 electrically connected to the busbar provides a unitary output connection from the busbar. The output lug 46 includes a socket 47 for receiving a conductor and a connector 48, such as a set screw or other threaded element for retaining an output conductor in the socket of the output lug. In this way, an output conductor can provide an output for the combined current of the power connected to the positive terminal assembly from the strings of solar panels. The positive output conductor and the negative output conductor can be connected with a downstream element in the circuit. For instance, the output from the combiner 20 may be connected with an inverter 90 as shown in FIG. 5. The inverter 90 inverts the power from direct current to alternating current. Although the output from the combiner box 20 may be connected with an inverter, the system is not limited to a circuit in which the output is fed to an inverter. For instance, the output may be connected to another PV combiner or a power storage device, such as a battery or an array of batteries.

In the present instance, the system also includes a current monitoring assembly 50 for monitoring the current flowing to the positive terminal assembly. The current monitoring assembly 50 is operable to detect whether there is a reduction in the current supplied by one of the strings connected with the circuit. If the current monitoring assembly detects a current below a threshold or sufficiently different from an expected value, a signal may be provided indicating that there is a problem with the string for which the low current was detected.

The current monitoring assembly 50 may include a sensor assembly 60. The sensor assembly 60 includes a plurality of sensors 64, each of which detects a characteristic of the electrical flow from one of the strings of solar panels. The sensors may be any of a variety of current detecting sensors, however, in the present instance, the current detecting sensors are Hall effect sensors 64.

The Hall effect sensors 64 are mounted on a circuit board 62 that is positioned adjacent the busbar 40. The sensors 64 are spaced apart along the circuit board so that each sensor is positioned adjacent one of the fingers 44 of the busbar. In particular, in the present instance, the sensors 64 are spaced apart to form two rows of sensors spaced apart from one another a distance substantially similar to the distance between adjacent fingers 44 of the busbar. In this way, each sensor is proximate one of the fingers to detect variations in the current in the respective finger. Additionally, each sensor is positioned closer to the respective busbar finger 44 that it is monitoring than to any of the remaining busbar fingers or than to the central body 42 of the busbar.

The sensors may be mounted on a circuit board that includes control elements or signal processing elements that process the signals from the sensors 64. However, in the present instance, the system includes a control board separate from the sensor board, which is electrically connected with the sensors 64 on the sensor board 62. Specifically, the sensor board 62 includes a sensor output connector 68 for providing an electrical connection for the output signal from each of the Hall effect sensors 64. A sensor input connector 54 provides a connection for connecting the sensor output connector 68 with the control board. In this way, an electrical path is provided between each sensor 64 and the control board 52.

The control board 52 may process the signals from the sensors 64 to detect whether the signal indicates a fluctuation in the input current (or voltage) that would be indicative of a problem with an element in the string connected with the respective busbar finger. In other words, if PV1 is connected to a first busbar finger, and the sensor 64 associated with the first finger detects a current below a predetermined threshold, then the control board may process the signal from the first sensor and provide a warning to an operator that there may be a malfunction in the first string of solar panels.

Although the control board may be designed to process the signals from the sensors and provide a warning to an operator, in the present instance, the control board includes a data communication element and an output connector 58 so that the signals from the control board may be exported to a data logging element 100. For instance, the control board may include a communication element for providing a signal using a common protocol, such as ModBus for communicating the sensor data to a remote device, such as a ModBus capable data logger, inverter or power meter. The remote device may log and/or analyze the data from the control board to determine whether the data indicates an error or malfunction in one or more of the power input elements (i.e. PV1-PV4), as well as identifying which of the input elements should be analyzed to determine if there is a malfunction. The remote device then provides signals or warnings to the operator indicating the detected malfunction and which power input element(s) appear to have a malfunction or other performance issue.

Referring to FIGS. 1-2, the sensor assembly 60 and the control board are disposed above the central body 42 of the busbar in the channel formed between the two rows of fuse holders 31. In the present instance, the sensor assembly 60 is connected to a base plate 80 formed of insulative material, such as plastic. The base plate 80 includes a central channel 82 formed to receive the bottom portion of the output lug 46 on the busbar. The sides of the base plate form generally planar surfaces that can lay against the bottom surface of the busbar between the fuse holders 31. The sensor assembly 60 is disposed over the busbar and connected with the base plate 80 by a plurality of connectors, such as screws formed of an insulative material, such as plastic. In this way, the busbar 40 is sandwiched between the sensor assembly 60 and the base plate 80.

Additionally, in the present instance, a thin electrically insulative layer 66 is disposed between the busbar 40 and the sensor assembly 60. The insulative layer 66 insulates the sensors 64 from the current in the central body 42 of the busbar or from the current flowing through adjacent fingers 44 of the busbar. The insulative layer 66 may be formed of a variety of materials, and in the present instance is a thin sheet of mica. A thin sheet of polyester could also be used.

As shown in FIG. 1-3, the control board 52 is connected to the sensor assembly 60 by one or more insulative connectors. The control board is positioned above the sensor assembly 60 within the channel formed between the rows of fuse holders 31. Alternatively, the control board may be positioned remotely from the busbar or the sensor assembly.

The positive terminal assembly 30 may also incorporate a power supply designed to utilize power from the high voltage DC busbar to operate the current monitoring system 50. Specifically, the busbar may operate under normal conditions at a voltage of 300-600 volts DC with respect to the ground plane. The power supply provides an operating voltage for the current monitoring system that is 5, 12 or 24 volts below the busbar voltage. Accordingly, the power supply allows the circuit board to operate at a voltage that is no more than approximately 24 volts different from the busbar voltage.

As discussed above, the system 10 includes a sensor assembly 60 that may include a plurality of sensors 64, such as Hall effect sensors. In some applications or configurations, it may be desirable to account for noise and/or background effects, such as magnetic fields produced by adjacent elements on the bus bar 40. Specifically, as discussed above, the bus bar 40 may include a plurality of separate elements, such as fingers 44, each of which may be connected with a separate input circuit. A separate Hall effect sensor may be mounted on each elongated finger to monitor the current flowing from the respective input circuit to the bus bar 40. The magnetic fields produced by current flowing through one of the fingers may produce a magnetic field that is sensed by more than one of the sensors in the sensor assembly. For instance, the sensor for detecting the current flowing through the first finger of the bus may also detect the magnetic field produced by current flowing through the second and third fingers. In fact, in some configurations, each sensor may detect some magnetic field produced by the current flowing through each of the other fingers.

In order to assess the current flowing through each finger, it may be desirable to compensate the signal from each sensor to account for the signal received from adjacent fingers or other signal that is not indicative of the current flowing through the particular finger. One manner of processing the signal to account for field produced by adjacent fingers is to determine a baseline sensor value for each sensor as follows. For a bus of N fingers, a known current is applied to the first finger and no current is applied to each of the remaining fingers. The sensors on fingers 2 through N are evaluated to determine what magnetic field is sensed in response to the current flowing through finger 1. The know current is then applied to finger 2 and no current is applied to fingers 1 and 3 through N. The sensors in fingers 1 and 3-N are evaluated to determine what magnetic field is sensed in response to the current flowing through finger 2. Similarly, the current is applied separately to each finger and the sensors are evaluated for each finger to determine what magnetic field is sensed at each finger in response to the signal flowing to each particular finger.

After applying the known current to each of the fingers and measuring the resulting magnetic field sensed by the sensors, the background noise a sensor senses can be determined, which can be compensated for when processing the signal for the sensor. Specifically, the compensation signal for background noise produced by current flowing through a finger (other than the current flowing through the finger being monitored) is proportional to the signal detected when current was applied to the finger while no current was applied to the remaining fingers. The baseline value for a sensor is based upon a summation of the compensation for each finger on the bus (other than the finger being monitored).

By way of example, for a bus having four fingers F1, F2, F3, F4, the compensation C1,2 for the sensor on F1 that compensates for the magnetic field produced by current flowing through F2 is proportionate to the signal detected by the sensor on F1 when the known current is applied to F2 and no current is applied to F1 and F3-F4. Similarly, the compensation C1,3 for the sensor on F1 that compensates for the magnetic field produced by current flowing through F3 is proportionate to the signal detected by the sensor on F1 when the known current is applied to F3 and no current is applied to F1, F2 and F4. The compensation C1,4 for the sensor on F1 that compensates for the magnetic field produced by current flowing through F4 is proportionate to the signal detected by the sensor on F1 when the known current is applied to F4 and no current is applied to F1-F3. The baseline is the sum of C1,2+C1,3+C1,4. In this way, a table of values can be generated for each finger based upon the compensation values for each other finger. The table can be used to determine the baseline for each finger.

Figure 7:
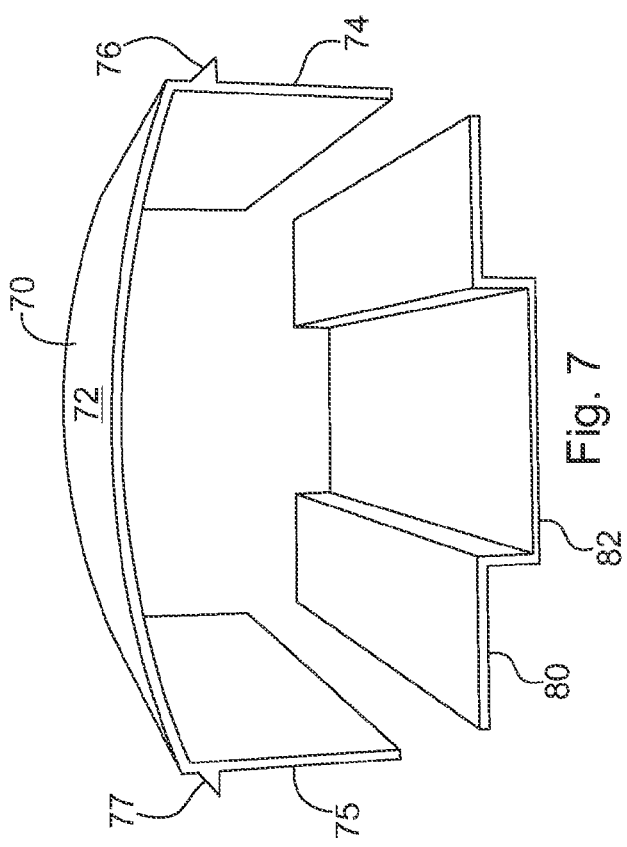
FIG. 7 is a perspective view of a cover and base for the positive input assembly illustrated in FIG. 1.

Referring to FIGS. 1, 2 and 7, the positive terminal assembly 30 may also include a removable cover 70 for enclosing the busbar 40 and current monitoring assembly 50. The cover is a generally inverted U-shaped channel having a cap 72 and two downwardly extending sides or legs 74, 75. In the present instance, the legs diverge, so that they form an angle with one another. The legs are spaced apart so that the distance between the legs 74, 75 adjacent the cap 72 is similar to the distance between the inner faces 37 or the opposing fuse holders. In other words, the distance between the legs adjacent the cap is similar to the width of the channel formed between the rows of fuse holders. Additionally, leg 74 diverges from leg 75 so that the terminal ends of legs 74, 75 are spaced apart farther than the ends adjacent the cap 72. The terminal ends of legs 74, 75 are spaced apart farther than the width of the channel between the rows of fuse holders.

Referring to FIG. 7, each leg or side wall 74, 75 includes a ridge 76, 77 extending along the outer surface of the leg. The ridges 76, 77 include a lower face forming a shoulder configured to abut the top surfaces 36 of the fuse holders as shown in FIGS. 1 and 2. The length of the side walls 74, 75 between the lower edge of the ridges 76, 77 and the terminal end of the legs is less than the distance between the top face 36 of the fuse holders and the fingers 44 of the busbar.

The cover 70 is formed of a resiliently deformable material that is also insulative, such as plastic. To attach the cover to the positive terminal assembly 30, the legs 74, 75 are flexed inwardly toward one another until the distance between the terminal ends of the legs is less than the width of the channel between the rows of fuse holders. The legs are then inserted into the channel between the rows of fuse holders until the ridges 76, 77 abut the top faces 36 of the fuse holders. After the legs 74, 75 are inserted into the channel between the rows of fuse holders, the resilience of the legs causes the legs to flex outwardly toward the fuse holders. In this way, the legs of the cover frictionally engage the rows of fuse holders to retain the cover on the assembly. Additionally, the ridges 76, 77 on the side walls provide a depth stop limiting the insertion of the cover into the channel to impede the ends of the cover from engaging the bus bar 40. Further, the ridges 76, 77 provide a sliding surface so that the cover can slide along the top surfaces of the fuse holders to expose portions of the current monitoring system 50 and/or the busbar 40 without removing the cover from the assembly.

Figure 8:
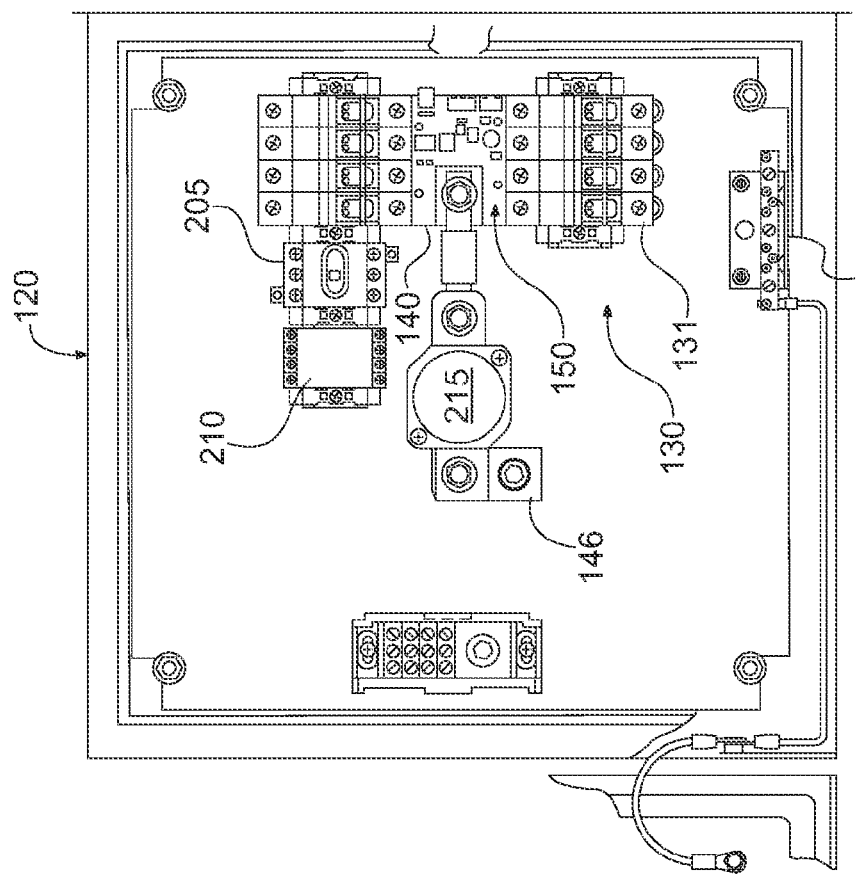
FIG. 8 is a plan view of an alternate embodiment of a system for combining direct current power.
Figure 9:
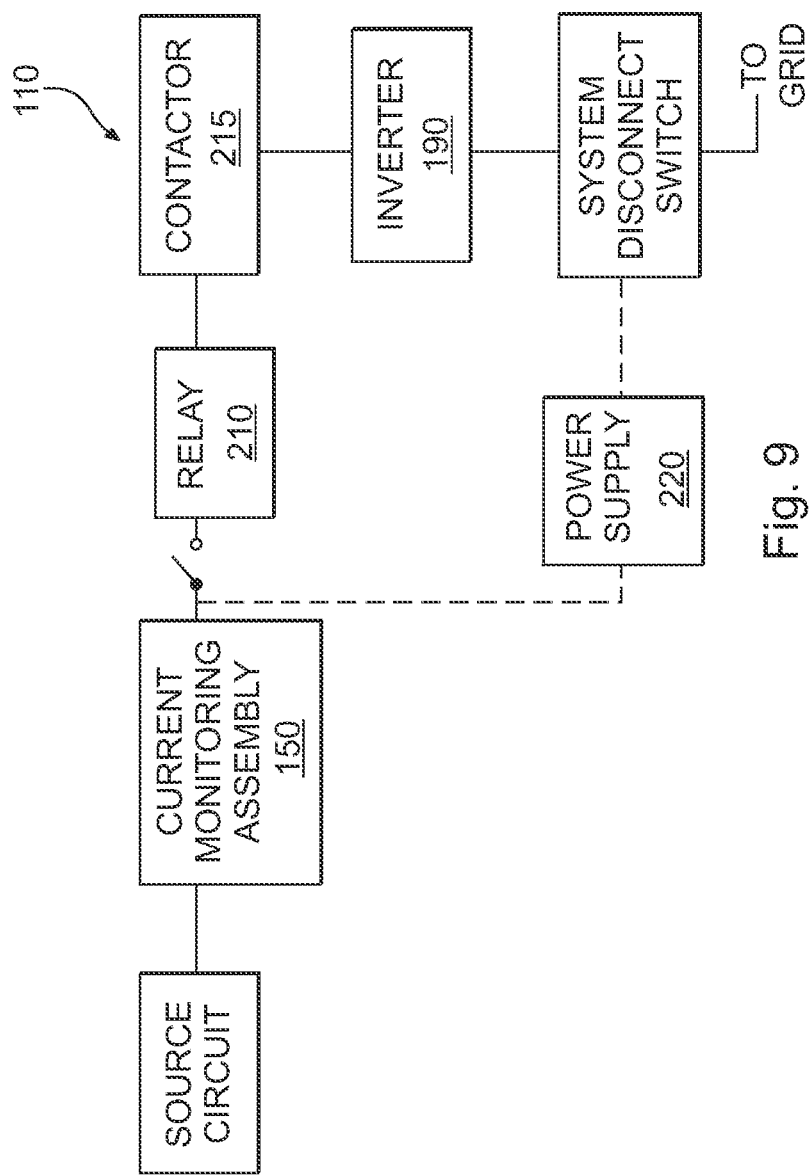
FIG. 9 is a schematic diagram of the system illustrated in FIG. 8.

Referring now to FIG. 8-9 an alternate embodiment of a system for combining the current from a plurality of output circuits, such as strings of solar panels is designated 110. The alternate system 110 includes a combiner box 120 housing a positive terminal assembly 130 having a bus bar 140 substantially similar to bus bar 40 described above. The system 110 further includes a current monitoring assembly 150 having a sensor assembly 160 substantially similar to sensor assembly 60 described above. The alternate system further includes a contactor 215 and a relay 210 for selectively disconnecting the current from the output circuits from the output of the combiner box 120.

Referring to FIG. 8, the positive terminal assembly includes fuse holders 131 that are substantially similar to the fuse holders 31 described above. The bus bar includes a plurality of elongated fingers similar to finger 44 described above. A sensor, such as a Hall effect sensor is mounted adjacent each finger as described above in the system illustrated in FIGS. 1-7. Each sensor is operable to detect the current flowing through the finger to which the sensor corresponds.

A contactor 215 is placed in the circuit between the positive terminal assembly 130 and a positive output lug 146, which is substantially similar to the positive output lug 46 described above. The contactor 215 comprises one or more normally open switches, so that the output from the combiner box 120 is normally switched off. An exemplary contactor is a series GX14 EPIC contactor sold by GIGAVAC a company in Carpinteria, Calif. A power supply 220 provides power to the contactor that can energize the contactor to close the one or more normally open switches so that current can flow from the combiner box 120 to the grid so that the electricity from the source circuits can be used. If the power to the contactor 215 from the power supply 220 is interrupted, the contactor opens the circuit to prevent the flow of electricity from the source circuit(s). The system 110 may include a switch to interrupt the power from the power supply to the contactor. The interrupt switch may include a manually operable actuator, and the power supply may be remote from the combiner box so that circuit between the combiner and the inverter can be controlled remotely.

It may be desirable to automatically disconnect the output from the combiner box 120 in response to a characteristic of the output from one or more of the source circuit(s). For instance, current from the combiner box may be switched off if the current from one or more of the source circuits falls outside an acceptable range. By way of example, if the current from one of the source circuits falls below a threshold then the reduced current may be indicative of a fault in the source circuit. Similarly, variation in the current from a source circuit exceeding a predetermined range within a predetermined time may be indicative of arcing in the source circuit. In response to the change in detected current, the circuit from the combiner box 120 may be automatically interrupted.

In one embodiment, the circuit from the combiner box 120 may be automatically interrupted by a relay 210 controlling the power from the power supply 220 to the contactor 215. The relay 210 may be controlled automatically by a variety of control circuits. In the present instance, the relay 210 is controlled by the current monitoring assembly 150. Specifically, the current monitoring assembly 150 may control the relay in response to the current detected by one or more of the sensors in the sensor assembly. More specifically, the current monitoring assembly 150 may be configured so that the relay is switched to an open state in response to detecting a current having a characteristic indicative of a fault or other problem. For instance, in an application in which the combiner box 120 receives power from a plurality of solar panels, each finger of the bus 140 is connected to different panels or arrays. Therefore, the current sensed by each Hall effect sensor may differ from the current detected by the other Hall effect sensors. However, the current detected by each sensor is generally stable over time under normal operating conditions. In contrast, if there is a problem in one of the source circuits, such as an arcing fault, the current may vary significantly more than under normal operating conditions. Accordingly, the current monitoring assembly may be configured so that in response to detecting a varying current in one of the bus fingers, the current monitoring assembly controls the relay to open the circuit, thereby interrupting the power from the combiner box to the grid. More specifically, switching the relay to an open condition opens the circuit from the power supply 220 to the contactor 215, thereby shutting off the flow of electricity from the combiner box to the grid. In one example, if the current varies more than a predetermined amount or percentage in a predetermined time, the current monitoring assembly sends a signal to the relay to open the circuit 210.

In the foregoing description, the relay 210 is operable to open or close the circuit from the combiner box to the grid. It should be understood that any of a variety of automatically controllable electro-mechanical switches may be controlled to open the circuit from the combiner 120 to the grid to interrupt the flow of electricity from the source circuits to the grid. Additionally, the relay may be a normally closed relay that receives a signal from the current sensing assembly to open in response to a fault, or the relay may be a normally open relay that receives a signal from the current sensing assembly to close as long as the current sensing assembly does not detect a fault. Once the current sensing assembly detects a fault, the signal to the relay ceases and the relay open the circuit.

Additionally, in the foregoing embodiment, the output circuit is controlled by a relay and a contactor working in combination. In certain applications it may be desirable to incorporate the control functionality into a single automatic switching component that is controlled based on feedback from the current sensors. Furthermore, although the circuit is described as having a single switching element (i.e. contactor 215) that controls the output of all of the source circuits simultaneously, it may be desirable to control each source circuit separately so that a particular source circuit can be interrupted without shutting down the entire system 120. Specifically, the current through each finger may be connected through a separate switching element, such as a contactor, which is controlled either directly or indirectly based on the current sensed for the current flowing through the particular finger. For instance, each finger may be connected to a separate relay, which in turn is connected to a separate contactor. If the current sensing assembly detects a fault based on the detected current for the finger, the current sensing assembly controls the relay associated with the finger, which in turn opens the power supply to the contactor for the finger, thereby opening the circuit from the finger. However, since each finger has a separate contactor and relay, the flow of electricity from the remaining fingers is not interrupted when the circuit from one of the fingers is opened.

In the embodiment in which a common contactor is used to open the circuit from the combiner box to the grid, a fault detected in one of the source circuits shuts down the flow of electricity from the combiner box for all of the source circuits, including the source circuits that are operating properly. Therefore, when the power from the combiner box is interrupted, it is not normally apparent which source circuit triggered the shut down. However, it is desirable to determine which source circuit triggered the shut down so that the source circuit can be analyzed to determine the potential source of the problem. Unless the particular source circuit can be identified, the operator may need to analyze the equipment for all of the source circuits, which significantly increases the labor required to identify the problem.

As described previously, the circuit may include a data logger that logs data regarding the signal sensed for each sensor in the sensor assembly. The user may analyze the data recorded by the data logger for each sensor to determine which sensor caused the shut down. Additionally, the circuit may be configured so that the data logger logs data received from the current sensing assembly identifying which sensor triggered the shut down.

As described above, the system is controlled by a controller that automatically shuts off the flow of electricity from the combiner box to the grid in response to detection of a current indicative of a problem in one of the source circuits (i.e. indicative of a fault). In the foregoing description, the current monitoring circuit 150 is described as incorporating the control functions for controlling the relay 210. However, it should be understood that a control circuit separate from the current monitoring assembly may be provided for controlling the relay. The separate control would be in communication with the current monitoring assembly to receive either signals corresponding to the sensed current for each finger or signal indicative of a fault in the detected current from one of the sensors. The separate control circuit would then control the relay 210 in response to the signal(s) received from the current sensing assembly.

In addition to an automatically controllable switching element, it may be desirable to incorporate a manually controllable switch for shutting down the output from the combiner box 120. For example, the system 110 may include a manually actuable switch 205 in series with the relay 210 and the power supply 220. The switch 205 is closed during normal operating procedures. However if the operator desires to disconnect the output from the combiner box, the operator can manually operate the switch to move the switch to the open position. In the open position, the switch opens the circuit from the power supply 220 to the contactor, so that the contactor changes to an open condition, opening the circuit from the combiner box to the grid.

It will be recognized by those skilled in the art that changes or modifications may be made to the above-described embodiments without departing from the broad inventive concepts of the invention. It should therefore be understood that this invention is not limited to the particular embodiments described herein, but is intended to include all changes and modifications that are within the scope and spirit of the invention as set forth in the claims.

The invention claimed is:

1. A system for combining direct current power produced by a plurality of photovoltaic elements, comprising:
an enclosure;
a first terminal assembly for receiving a conductor of a first polarity from each of the photovoltaic elements, wherein the first terminal assembly is disposed within the enclosure;
a second terminal assembly for receiving a conductor of a second polarity from each of the photovoltaic elements, wherein the second polarity is opposite the first polarity, and the second terminal assembly is disposed within the enclosure, and wherein the second terminal assembly comprises:
a busbar in electrical communication with each of the conductors of a second polarity from the photovoltaic elements so that the direct current from the photovoltaic elements is combined to form a single current at the busbar, wherein the busbar comprises:
a central conductive body;
a plurality of elongated fingers projecting outwardly from the central conductive body;
a plurality of over-current protection elements each connected to one of the conductors of a second polarity from one of the photovoltaic elements and one of the fingers of the busbar, wherein the over-current protection elements are operable to break the circuit between the busbar and the respective power producing photovoltaic element in the event the current from photovoltaic element exceeds a threshold, and wherein the fingers of the busbar are elongated to space the central conductive body of the busbar away from the over-current protection elements when the busbar fingers are connected with the over-current protection elements; and
a plurality of Hall effect sensors, wherein the Hall effect sensors are spaced apart from one another and each Hall effect sensor is positioned adjacent a separate one of the busbar fingers so that each Hall effect sensor is operable to detect variations in the current flowing through one of the busbar fingers.

2. The system of claim 1 comprising an inverter for receiving the combined power from the first terminal assembly and the second terminal assembly and converting the current from direct current to alternating current.

3. The system of claim 1 comprising a control board operable to receive signals from the Hall effect sensors.

4. The system of claim 3 wherein the control board is operable to process the signals from the Hall effect sensors and provide an output identifying which of the photovoltaic elements needs to be analyzed based on the signals received from the Halls effect sensors.

5. The system of claim 3 wherein the control board comprises a communication element for communicating the data from the Hall effect sensors with a remote device.

6. The system of claim 5 wherein the remote device is a data logging element.

7. The system of claim 5 wherein the remote device is operable to provide an output to a user indicative of a malfunction in a particular photovoltaic element when the respective Hall effect sensor indicates a current below a predetermined threshold.

8. The system of claim 3 wherein the control board comprises a power supply element for receiving power from the busbar and providing power to the control board so that the voltage difference between the control board and the busbar is less than approximately 50 volts.

9. The system of claim 8 wherein the power supply provides power so that the voltage difference between the control board and the busbar is less than or equal to approximately 24 volts.

10. A system for combining direct current power produced by a plurality of photovoltaic elements, comprising:
an enclosure;
a busbar in the enclosure in electrical communication with a plurality of source circuits delivering power from the photovoltaic elements;
a plurality of sensors adjacent the busbar for sensing the flow of current from each source circuit;
an automatically controllable switching element for controlling the flow of electricity from the busbar;
a controller operable to control the switching element in response to the current sensed by one of the sensors;
wherein the controller is operable to control the switching element to open the switch to interrupt the flow of electricity from the busbar in response to one of the sensors detecting a current indicative of a fault in one of the circuits delivering power from the one or more photovoltaic elements.

11. The system of claim 10 where the switching element is a normally open contactor.

12. The system of claim 10 wherein the sensors comprise Hall effect sensors.

13. The system of claim 10 wherein the busbar comprises a plurality of separate elongated conductive elements spaced apart from one another wherein each conductive element is connected with a different source circuit and a separate sensor is mounted adjacent each conductive element.

14. The system of claim 10 wherein the controller is operable to control the switching element is response to one of the sensors detecting a current varying outside an acceptable range.

15. The system of claim 14 wherein the controller is operable to control the switching element in response to one of the sensors detecting a current varying outside an acceptable range within a predetermined time period.

16. The system of claim 10 wherein the switching element comprises a relay or a contactor.

17. The system of claim 16 wherein the switching element comprises a relay and a contactor.

18. A system for combining direct current power produced by a plurality of photovoltaic elements, comprising:
an enclosure;
a first terminal assembly for receiving a conductor of a first polarity from each of the photovoltaic elements;
a second terminal assembly for receiving a conductor of a second polarity from each of the photovoltaic elements, and wherein the second terminal assembly comprises:
a busbar in electrical communication with each of the conductors of a second polarity from the photovoltaic elements so that the direct current from the photovoltaic elements is combined to form a single current at the busbar, wherein the busbar comprises a plurality of elongated fingers projecting outwardly from a central conductive body: and
a plurality of Hall effect sensors, wherein the Hall effect sensors are spaced apart from one another and each Hall effect sensor is positioned adjacent a separate one of the busbar fingers so that each Hall effect sensor is operable to detect variations in the current flowing through one of the busbar fingers.

19. The system of claim 18 comprising:
a switching element switching element for controlling the flow of electricity from the busbar;
a controller operable to control the switching element in response to the current sensed by one of the sensors;
wherein the controller is operable to control the switching element to open the switch to interrupt the flow of electricity from the busbar in response to one of the sensors detecting a current indicative of a fault in one of the circuits delivering power from the one or more photovoltaic elements.

20. The system of claim 19 where the switching element is a normally open contactor.

21. The system of claim 19 wherein the controller is operable to control the switching element is response to one of the sensors detecting a current varying outside an acceptable range.

22. The system of claim 21 wherein the controller is operable to control the switching element in response to one of the sensors detecting a current varying outside an acceptable range within a predetermined time period.

23. The system of claim 18 wherein the switching element comprises a relay or a contactor.

24. The system of claim 23 wherein the switching element comprises a relay and a contactor.

* * * * *